(12) United States Patent
Mehta

(10) Patent No.: US 11,705,878 B2
(45) Date of Patent: *Jul. 18, 2023

(54) INTELLIGENT AUDIO OUTPUT DEVICES

(71) Applicant: eBay Inc., San Jose, CA (US)

(72) Inventor: Jigish Mehta, Union City, CA (US)

(73) Assignee: eBay Inc., San Jose, CA (US)

( * ) Notice: Subject to any disclaimer, the term of this patent is extended or adjusted under 35 U.S.C. 154(b) by 157 days.

This patent is subject to a terminal disclaimer.

(21) Appl. No.: 17/156,014

(22) Filed: Jan. 22, 2021

(65) Prior Publication Data

US 2021/0143785 A1    May 13, 2021

Related U.S. Application Data

(63) Continuation of application No. 15/598,047, filed on May 17, 2017, now Pat. No. 10,917,060, which is a continuation of application No. 14/566,525, filed on Dec. 10, 2014, now Pat. No. 9,685,926.

(51) Int. Cl.
  *H03G 3/32* (2006.01)
(52) U.S. Cl.
  CPC ..................................... *H03G 3/32* (2013.01)
(58) Field of Classification Search
  None
  See application file for complete search history.

(56) References Cited

U.S. PATENT DOCUMENTS

| | | | |
|---|---|---|---|
| 8,144,904 B2 | 3/2012 | Giese | |
| 8,538,049 B2 | 9/2013 | Apfel et al. | |
| 9,325,849 B1 | 4/2016 | Brydon et al. | |
| 9,685,926 B2 | 6/2017 | Mehta | |
| 9,830,924 B1* | 11/2017 | Degges, Jr. | G10L 15/22 |
| 10,917,060 B2 | 2/2021 | Mehta | |
| 2005/0089177 A1 | 4/2005 | Hughes et al. | |
| 2012/0262582 A1* | 10/2012 | Kimchi | H04M 1/72454 |
| | | | 348/E7.085 |
| 2014/0270200 A1 | 9/2014 | Usher et al. | |
| 2015/0161204 A1 | 6/2015 | Kim | |
| 2016/0173049 A1 | 6/2016 | Mehta | |
| 2017/0257072 A1 | 9/2017 | Mehta | |

FOREIGN PATENT DOCUMENTS

CN    101742138 A    6/2010

OTHER PUBLICATIONS

Volume control system, Derwent-Ace-No. 2010-J05493 Li J TV, Nov. 7, 2008, 2 pages.

(Continued)

*Primary Examiner* — Quynh H Nguyen
(74) *Attorney, Agent, or Firm* — Holland & Hart LLP

(57) ABSTRACT

An audio output device may include one or more audio sensors configured to detect ambient sound and noises around the audio output device. The audio output device may include a controller configured to analyze the detected sound and noises and may adjust audio settings of the audio output device accordingly. In an embodiment, the controller may analyze and recognize that the detected noise is another person's attempt to get the user's attention or to talk to the user, such as audio sound of the user's name. In response, the controller may stop the audio output or lower the volume of the audio output.

18 Claims, 4 Drawing Sheets

(56) References Cited

OTHER PUBLICATIONS

Final Office Action received for U.S. Appl. No. 14/566,525, dated Aug. 2, 2016, 12 pages.
Non-Final Office Action received for U.S. Appl. No. 14/566,525, dated Nov. 28, 2016, 6 pages.
Non-Final Office Action received for U.S. Appl. No. 14/566,525, dated Mar. 31, 2016, 11 pages.
Notice of Allowance received for U.S. Appl. No. 14/566,525, dated Feb. 17, 2017, 5 pages.
Advisory Action received for U.S. Appl. No. 15/598,047, dated Feb. 4, 2019, 3 pages.
Advisory Action Received for U.S. Appl. No. 15/598,047, dated Oct. 11, 2019, 5 pages.
Final Office Action received for U.S. Appl. No. 15/598,047, dated Nov. 26, 2018, 16 pages.
Final Office Action received for U.S. Appl. No. 15/598,047, dated Aug. 5, 2019, 18 pages.
Non Final Office Action Received for U.S. Appl. No. 15/598,047, dated Mar. 31, 2020, 17 pages.
Non-Final Office Action received for U.S. Appl. No. 15/598,047, dated Jun. 21, 2018, 15 pages.
Non-Final Office action received for U.S. Appl. No. 15/598,047, dated Apr. 2, 2019, 17 pages.
Notice of Allowance received for U.S. Appl. No. 15/598,047, dated Aug. 12, 2020, 5 pages.

* cited by examiner

INTELLIGENT AUDIO OUTPUT DEVICES

CROSS REFERENCE TO RELATED APPLICATIONS

This application is a continuation application of U.S. patent application Ser. No. 15/598,047, filed May 17, 2017, which is a continuation application of U.S. patent application Ser. No. 14/566,525, filed Dec. 10, 2014, now issued as U.S. Pat. No. 9,685,926, entitled, "INTELLIGENT AUDIO OUTPUT DEVICES," which are claimed hereby, and the disclosure of each of which is hereby incorporated by reference herein in its entirety.

BACKGROUND

Field of the Invention

The present invention generally relates to audio output devices, and in particular, to intelligent audio output devices that automatically adjust audio settings based on the surrounding environment and events.

Related Art

Audio output devices, such as ear phones, headphones, audio speakers, boom boxes, and the like, are widely used by consumers to listen to music or other audio presentations. When a user uses the audio output devices to listen to music or other audio presentations, the user may become less aware of the surrounding sound occurrences, such as when someone is calling the user or is attempting to obtain the user's attention, especially if the user is wearing an over-the-ear or in-ear audio output device, such as headphones or earphones. As such, it may be frustrating for someone who is trying to get the user's attention. Thus, there is a need for an audio output device that intelligently adjusts sound volume to mitigate the aforementioned problems.

Figure 1:
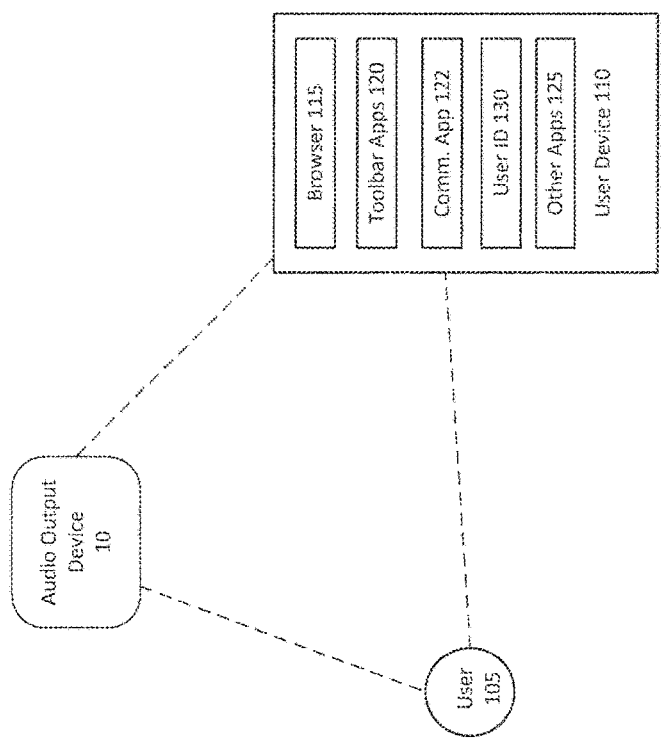
FIG. 1 is a block diagram of a system suitable for implementing an intelligent audio output device card according to an embodiment.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

According to an embodiment, an audio output device may include one or more audio sensors configured to detect ambient sound and noises around the audio output device, including directionality of the sound. The audio output device may include a controller configured to analyze the detected sound and noises and may adjust audio settings of the audio output device accordingly. In an embodiment, the controller may analyze and recognize that the detected noise is another person's attempt to get the user's attention or to talk to the user, such as audio sound of the user's name. In response, the controller may stop the audio output or lower the volume of the audio output.

In an embodiment, the user may perform an initial set up of the audio output device by speaking a few words or sentences to the audio output device. The audio output device may learn the user's voice and may adjust audio settings when the user's voice is detected. For example, when the user begins to talk while listening to the audio output device, the controller may determine that the user is beginning a conversation with another person and may lower the volume or pause the audio output of the audio output device. When the user stops talking or when both the user and the other person stops talking, the controller may resume previous audio settings after waiting for a predetermined amount of time.

In an embodiment, the controller of the audio output device may monitor the user's audio preference in view of the ambient noises or surrounding sounds. The controller may then learn the various audio setting preferences of the user in view of the ambient noises or surrounding sounds. For example, the controller may detect that the user usually turns down the volume or stops the audio output when the user begins to speak to another person. In another example, the controller may detect that the user usually turns down the volume when another person calls the user's name or nickname. The controller may monitor and learn the user's preferences and may automatically adjust the audio output device accordingly.

In an embodiment, the controller may detect that the user prefers certain audio settings for certain type of location or certain ambient noise. For example, the controller may detect that the user prefers light bass in the relatively quiet office environment and prefers heavy bass when the user is in a moving vehicle, such as when the user is driving in a car. In another example, the controller may detect that the user prefers higher volume in a crowded coffee shop with lots of people's voices and noises and prefers lower volume in a quiet library.

In an embodiment, the controller may detect that the user appears to consider certain person's voices as important. For example, the user may stop the audio output or lower the audio volume when certain person's voice is detected, such as a son, daughter, grandparent, supervisor, etc. The controller may learn a collection of important people's voices for the user. As such, when the controller detects the voice of one of the important people's voice, the controller of the audio output device may adjust the audio output settings accordingly to help the user hear this voice, especially when the user is listening to loud audio music or sound.

In an embodiment, the audio output device may have multiple different audio output settings for different situations. For example, the audio output device may have a teleconference audio setting, a music audio setting, an airplane audio setting, a driving audio setting, a phone conversation setting and the like. The controller of the audio output device may automatically switch to the appropriate settings based on the learned user preferences and the detected ambient noise and/or surrounding sounds.

FIG. 1 is a block diagram of a system 100 suitable for managing audio output devices according to an embodiment. System 100 may comprise or implement a plurality of computers, devices, and/or software components that operate to perform various audio controls, such as setting or adjusting an audio output level or starting/stopping an audio output. System 100 may include a user device 110 and an audio output device in communication over wired or wireless communication. A user 105, such as a consumer, utilizes audio output device 10 to listen to various audio presentations. For example, the user device 110 may store and/or receive audio information and may feed the audio information to the audio output device 10 to be output from the audio output device 10. Although only one audio output device 10 is shown, a plurality of audio output devices may be connected to the user device 110 to output audio presentations.

User device 110 and audio output device 10 may each include one or more processors, memories, and other appropriate components for executing instructions such as program code and/or data stored on one or more computer readable mediums to implement the various applications, data, and steps described herein. For example, such instructions may be stored in one or more computer readable media such as memories or data storage devices internal and/or external to various components of system 100

User device 110 may be implemented using any appropriate hardware and software configured for wired and/or wireless communication over the internet. For example, in one embodiment, user device 110 may be implemented as a personal computer (PC), a smart phone, wearable device, laptop computer, and/or other types of computing devices capable of transmitting and/or receiving data, such as an iPad™ from Apple™.

User device 110 may include one or more browser applications 115 which may be used, for example, to provide a convenient interface to permit user 105 to browse information available over the internet. For example, in one embodiment, browser application 115 may be implemented as a web browser configured to view information available over the Internet, such as a user account for setting up a shopping list and/or merchant sites for viewing and purchasing products and services. User device 110 may also include one or more toolbar applications 120 which may be used, for example, to provide client-side processing for performing desired tasks in response to operations selected by user 105. In one embodiment, toolbar application 120 may display a user interface in connection with browser application 115.

User device 110 may further include other applications 125 as may be desired in particular embodiments to provide desired features to user device 110. For example, other applications 125 may include security applications for implementing client-side security features, programmatic client applications for interfacing with appropriate application programming interfaces (APIs) over the internet, or other types of applications.

Applications 125 may also include email, texting, voice and IM applications that allow user 105 to send and receive emails, calls, and texts through the internet or the telephone network, as well as applications that enable the user to communicate, transfer information, make payments, and otherwise communicate and receive information for line management as discussed herein. User device 110 includes one or more user identifiers 130 which may be implemented, for example, as operating system registry entries, cookies associated with browser application 115, identifiers associated with hardware of user device 110, or other appropriate identifiers, such as used for payment/user/device authentication. In one embodiment, user identifier 130 may be used by a payment service provider to associate user 105 with a particular account maintained by the payment provider. A communications application 122, with associated interfaces, enables user device 110 to communicate within system 100. User device 110 may include a short range wireless communication device, such as a Bluetooth device, a Bluetooth Low Energy (BLE) module, a Near-Field Communication (NFC), WiFi communication module, and the like. For example, user device 110 may communicate with the audio output device 10 wirelessly.

Figure 2:
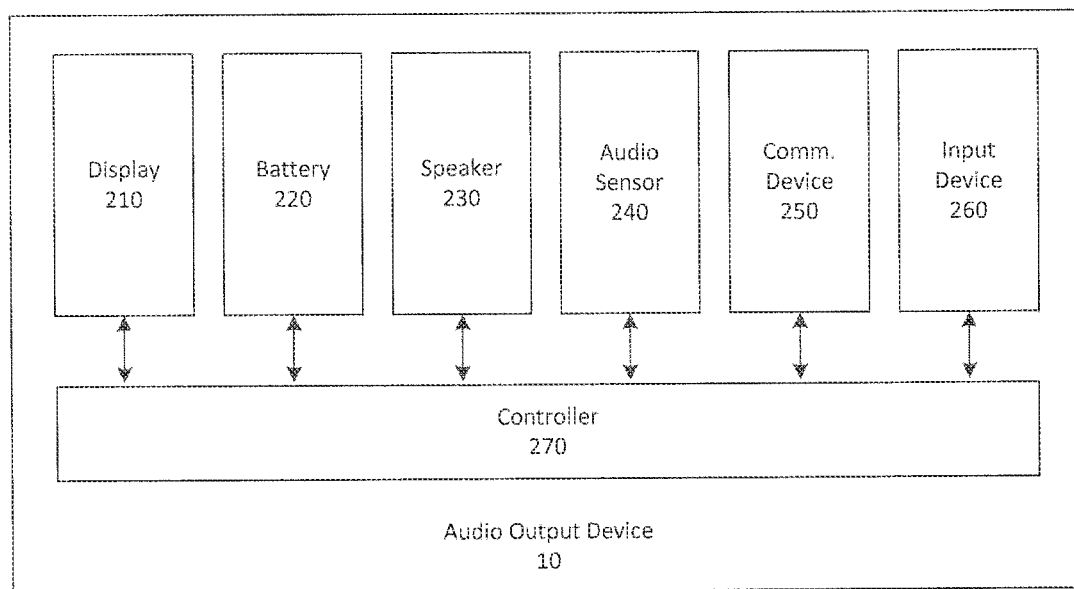
FIG. 2 is a functional block diagram of an intelligent audio output device according to one embodiment.

FIG. 2 is a functional block diagram of an audio output device 10 according to one embodiment. The audio output device 10 may be a peripheral device, such as a headphone, an earphone, a speaker, or the like, that is configured to be connected to the user device 110 to receive and output audio presentations fed from the user device 110. In some embodiments, the audio output device 10 may be a standalone device configured to output audio by reading a recording medium, such as CD, cassette, or by receiving digital signals by wired or wirelessly from a network or the internet. In an embodiment, the audio output device 10 may be a part of the user device 110. In some embodiments, the audio output device 10 may be connected to one or more other devices simultaneously to output audio presentations from different devices. Non-limiting examples of audio output devices include a television, a car speaker, a portable speaker, a phone, a computing tablet, and a radio.

As shown in FIG. 2, the audio output device 10 may include a display 210 configured to display information related to the audio settings and audio presentations of the audio output device 10. The display 210 may be an electrophoretic ink display or an LED display. In an embodiment, the display 210 may be a touch screen configured to receive user input. A battery 220 may be included with the audio output device 10. The battery 220 may be a replaceable battery, such as AAA battery, AA battery, or the like. In an embodiment, the battery may be a rechargeable battery. The battery 220 is configured to provide electric power to the various components of the audio output device 10. In an embodiment, the battery 220 may be charged wirelessly by at a wireless charging station or charging pad. For example, the battery 220 may be charged while the audio output device 10 is placed on a charging pad or charging station via inductive charging without being plugged in.

The audio output device 10 may include a speaker 230 configured to output audio sound. In particular, the speaker 230 may include components, such as a magnet, a voice coil, a diaphragm, an amplifier, and the like, that are configured to convert electrical signals into audio sound. The audio output device 10 may include an audio sensor 240. The audio sensor 240 may be configured to capture audio sound around the audio output device 10. The audio sensor 240 may include an acoustic-to-electric transducer configured to convert sound into electrical signals. In some embodiments, the audio sensor 240 may include an array of transducers configured to detect a direction of a sound. The audio sensor 240 may include one or more of an electromagnetic induction type transducer, a capacitive type transducer, and a piezoelectric type transducer.

The audio output device 10 also may include a communication device 250. The communication device 250 may include one or more of a Bluetooth communication module, a Bluetooth Low Energy (BLE) module, a Near-Field Communication (NFC) module, a WiFi communication module, and the like. In some embodiments, the audio output device 10 may include wired communication modules, such as a Universal Serial Bus (USB) connection module, a mini USB connection module, an Ethernet communication module, various types of audio connections, such as an audio phone jack, a banana plug, RCA, TOSLINK, HDMI, and the like. As such, the audio output device 10 may communicate with user device 110 or other devices via the communication device 250.

The audio output device 10 also may include an input device 260, such as a touch screen, buttons, microphone, and the like, configured to receive the user 105's input. For example, the user 105 may enter various audio settings and communication settings at the audio output device 10 via the input device 260. The audio output device card 10 further may include a controller 270. The controller 270 may include one or more of a microprocessor and an integrated circuit, such as an Application Specific Integrated Circuit (ASIC). The controller 270 may include memories and processors configured to store and execute programs and applications to control the operations of various components of the audio output device 10.

Figure 3:
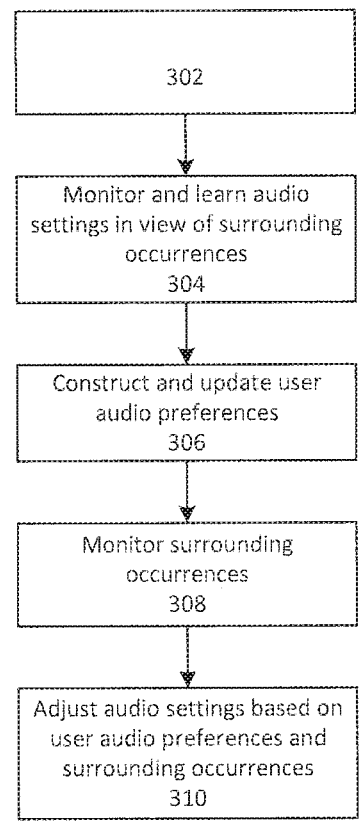
FIG. 3 is a flowchart showing a process for implementing an intelligent audio output device according to one embodiment.

FIG. 3 is a flowchart showing a process for managing an intelligent audio output device according to one embodiment. At step 302, the audio output device 10 or the user device 110 may be set up to include or be associated with the user 105's audio profile. The audio profile may include the user 105's information, such as the user 105's name, the user 105's default audio settings, and the user 105's audio preferences at different situations or circumstances. For example, the user 105 may set up different audio output modes for different locations or environments, such as a driving mode for driving in a car and a café mode for listening to music in a coffee shop. In another example, the audio profile may include different settings for when the audio output device 10 is connected to different devices. For example, the audio output device 10 may have a mobile phone setting for connection to a mobile phone and a laptop setting for connection to a laptop. The user 105 may enter information for the audio profile at the audio output device 10 or at the user device 110.

At step 304, the audio output device 10 or the user device 110 may monitor and learn the audio settings preferred or set by the user 105 in view of the surrounding audio occurrences. In particular, the audio output device 10 may continuously monitor the ambient noises and/or sounds surrounding the audio output device 10 and the audio settings set by the user 105 for the various environments and audio occurrences. For example, the audio output device 10 may detect that the user 105 prefers heavy bass with the ambient noise of the interior of the car and that the user 105 prefers medium bass with the ambient noise of a café. In another example, the audio output device 10 may learn that the user 105 prefers lower volume in a relative quiet ambient noise inside a library and prefers louder volume in a relative louder ambient noise on a street.

The audio sensor 240 may capture both the ambient noises of the location or environment, such as the background sounds or noise that occurs frequently or constantly in the location or environment. The audio sensor 240 also may detect sound occurrences such as any audio sound that is different or deviate from the ambient or background noise. The ambient noise may include outputs from a headphone, speaker, earphone, TV, etc., such various sound sources that are "on" in a room the user is in, or noises or the people or crowd, noises from air condition in a room, noises from general street traffic, and the like. Sound occurrences may include another user calling out to the user, a baby crying, a siren, a call for help, the user's name, doorbell, phone ring, gun shots, and any other sound that deviates from the background or ambient noise. As such, the sound occurrences and the ambient noises may be analyzed to determine the appropriate audio settings for the audio output device. For example, the volume level may be adjusted (reduce a little, reduce a lot, shut off, pause) in response to a sound occurrence or a change in ambient noise indicating a change in location or environment.

The audio output device 10 may monitor various audio occurrences, such as the voice of the user 105 or the voices of people associated with the user 105, phone rings, bells, TV noises, emergency sirens from police or emergency vehicles, and the like. Voice recognition and natural language processing techniques may be used to analyze and derive meanings from voices or sounds captured by the audio output device 10. Thus, for example, the audio output device 10 may learn that the user 105 turns down or turns off the volume when the user 105 is driving in a car and hears emergency sirens. In another example, the audio output device 10 may learn that the user 105 turns down or turns off the volume when the user 105 begins to speak or when another person calls the user 105's name and begins to speak to the user 105. In still another example, the audio output device 10 may learn that the user 105 turns off or turns down the volume when the user 105's phone rings or when the user begins a phone conversation by saying the word "hello" into the phone. In yet another example, the audio output device 10 may learn that the user 105 turns off the volume, turns down the volume, pauses the sound, or stops the sound playback upon hearing a voice of a particular person, such as a son, daughter, grandparent, or boss. Thus, the audio output device 10 may learn the various audio preferences of the user 105 based on the user 105's interactions with the audio output device 110 in response to the ambient sound and occurrences detected around the audio output device 10. In an embodiment, the user 105 may actively set up and train the audio output device 10 to recognize certain occurrences. For example, the user 105 may speak into the audio output device 10 to designate the user 105's voice and/or the user 105's name during the initial set up process of the audio output device 10. In another example, the user 105 may have others speak into and record their voices as ones who would cause sound to be lowered or stopped.

At step 306, the audio output device 10 or the user device 110 may construct and update user audio preferences. In particular, based on the monitored user interactions with the audio output device 10 and audio setting adjustments made by the user 105 in view of the surrounding sound or occurrences detected by the audio sensor 240, the controller 270 may construct various audio preferences of the user 105 accordingly. In an embodiment, the controller 270 may calculate a probability score for an audio setting based on the detected surrounding environment. For example, based on the audio setting history, the controller 270 may determine that there is 85% probability that the user 105 prefers lower volume in a quiet ambient environment inside a library and that there is a 70% probability that the user 105 prefers loud bass in a moving car. In another example, the controller 270 may determines that there is a 90% probability that the user 105 prefers lower output volume at the audio output device 10 when the user 105's name is called by another person. The controller 270 may implement the user 105's preference when the calculated probability exceeds a threshold, such as 80%.

At step 308, the audio output device 10 may monitor the ambient noises or occurrences surrounding the audio output device 10. The audio sounds may be captured by the audio sensor 240 and may be analyzed by the controller 270. The controller 270 may use audio filters, voice recognition, and/or natural language processing to determine the meaning and context of the ambient noise and sounds. The controller 270 may capture the ambient noise and may compare the current ambient noise with that of the previously monitored ambient noise to determine whether the current ambient noise is one that required audio adjustment. For example, when the user 105 is in a noisy airport, the controller 270 may detect the noisy ambient noise at the airport and may compare the noisy ambient noise with the various ambient noise profiles previously observed by the controller 270. If the user 105 has an ambient noise profile for the airports, the controller 270 may adjust the audio settings of the audio output device 10 according to the user 105's preference for the matching ambient noise profile.

In an embodiment, the controller 270 may capture the various sound occurrences, such as voice, rings, beeps, sirens, TV audio, radio, and other sound occurrences. The controller 270 may compare the current sound occurrence with the sound profiles previously observed by the controller 270. If there is a matching sound profile, the controller 270 may adjust the audio settings of the audio output device 10 according to the user 105's preference for that matching sound profile. For example, the controller 270 may detect a voice calling for the user 105's name. The controller 270 may recognize the user 105's name by voice recognition and natural language processing. In another example, the controller 270 may recognize the user 105's or another's voice and when the user 105 or another begins to talk or speak.

At step 310, the audio output device 10 may adjust the audio settings based on the user 105's audio preference and the detected ambient noise and/or sound occurrences around the audio output device 10. In an embodiment, after analyzing the sound occurrences and ambient noises, the controller 270 may compare and determine whether the sound occurrences and ambient noises matches with ones previously designated for certain audio settings. If so, the controller 270 may adjust the audio settings of the audio output device 10 accordingly. In particular, the controller 270 may calculate a similarity score between the detected ambient noise and/or sound occurrence with the ones previously designated for specific audio settings. The higher the similarity score the more likely the detected ambient noise and/or sound matches the ones designated for specific audio settings. The controller 270 may adjust the audio settings accordingly when the similarity score exceeds a certain number.

In an embodiment, when the controller 270 determines that the sound occurrence resembles the user 105's voice indicating that the user 105 is starting to talk, the controller 270 may automatically lower the volume of the audio output device 10. When the user 105's voice is detected, the controller 270 may monitor the voice for several seconds before adjusting the volume, in order to ensure that the user 105 is actually starting a conversation. When the conversation ends, such as that the user 105's voice and the other people's voices no longer are detected, the controller 270 may adjust the volume of the audio output device 10 back to the previous level.

In an embodiment, when the controller 270 detects a voice resembling the user 105's name or nickname, the controller 270 may automatically lower the volume of the audio output device 10. As such, the user 105 may hear the voice calling the user 105. The controller 270 may continue to monitor the interactions between the user 105 and the other users to determine whether they are starting a conversation. If so, the controller 270 may keep the audio output device 10 at low volume. When the controller 270 detects that the conversation has ended (no more voices detected), the controller 270 may then return the volume back to the previous level. In some embodiments, the controller 270 may remember the voices of the other people who called and conversed with the user 105. As such, the controller 270 may better recognize the voices of people who are related to and who are important to the user 105.

In an embodiment, the controller 270 may detect that a doorbell or a phone is ringing. The controller 270 may lower the volume of the audio output device 10 such that the user 105 may hear the ring. In some embodiments, the controller 270 may recognize the type of doorbell or the ring type of the user 105's phone. This may be learned or may be input by the user 105.

In an embodiment, the audio output device 10 may be implemented and/or installed in a vehicle. The controller 270 may detect that the user 105 is driving in a car based on the detected ambient noise. The controller 270 may monitor sound occurrences while the user 105 is driving. The controller 270 may detect a siren and may automatically lower the output volume of the audio output device 10, such that the user 105 may be able to hear the siren and may take caution for any emergency vehicles passing by. In particular, the controller 270 may determine whether the emergency vehicle is approaching in a direction toward the user 105 based on the increasing intensity of the siren (increasing in decibel). The controller 270 may decrease or increase the volume of the speaker 230 based on whether the siren is approaching toward or departing from the user 105.

In another embodiment, the controller 270 may detect honking from other vehicles and may lower the output volume of the audio output device 10, such that the user 105 may take caution for other vehicles traveling around the user 105's vehicle. Other sound occurrences, such as bells at railroad crossings or other sounds that may require the user 105's extra attention, may also cause the controller 270 to lower the output volume of the audio output device 10.

In an embodiment, the controller 270 may detect that the user 105 is in a noisy café or at a noisy party based on the ambient noise. The controller 270 may automatically adjust the bass and the volume of the audio output device 10 based on how noisy the café or the party is. In some embodiments, the controller 270 may increase the volume or bass setting when the party or the café becomes noisier. However, when someone calls the user 105's name in the noisy café or noisy party, the controller 270 may lower the volume and/or bass, such that the user 105 may hear the person calling out to the user.

In an embodiment, the audio output device 10 may be linked or paired with multiple different devices, such as a mobile phone, a laptop, and a car. Each of the mobile phone, the laptop, and the car may feed different audio presentations to the audio output device 10. The controller 270 may select the appropriate audio feed to output. For example, the user 105 may be listening to music fed from the laptop. When a call is received at the mobile phone, the audio output device 10 may switch to the mobile phone to allow the user 105 to take the call. When there is certain information, such as vehicle maintenance info, that needs to be communicated to the user 105, the audio output device 105 may switch to the audio feed of the car.

Accordingly, the controller 270 may monitor and analyze various ambient noises and sound occurrences around and external to the audio output device 10 and may adjust the audio settings of the audio output device 10 automatically to provide convenience to the user 105. In particular, the user 105's audio preferences may be learned from the user 105's interactions with the audio output device 10 and/or from user input.

In other embodiments, sound adjustment of the audio output device 10 depends on one or more of a directionality of sound, intensity or volume of sound, type of sound (crying, sirens, etc.), meaning of words (conveying urgency, conveying a request of the user's attention, etc.), who or what the sound is coming from (e.g., son, daughter, grandparent, boss), and the like from the audio output device 10 and/or another detected audio source (device, human, or animal). For example, an audio source away from the user and emitting sound away from the user may not necessarily need sound adjustment (or minimal adjustment) even though that audio source detects another sound source intended for the user because one or more of the factors above indicates adjusting the audio sound source would not provide any advantages to the user. In other embodiments, a plurality of audio output devices 10 may be adjusted together to provide a desired outcome for the user. For example, one or more audio output devices may be lowered in volume, one or more other audio output devices may be paused, and one or more audio output devices may be paused or shut off, all based on detection of one or more sounds from other audio source(s). [Dan, if you can, please provide some examples based on the above.]

Figure 4:
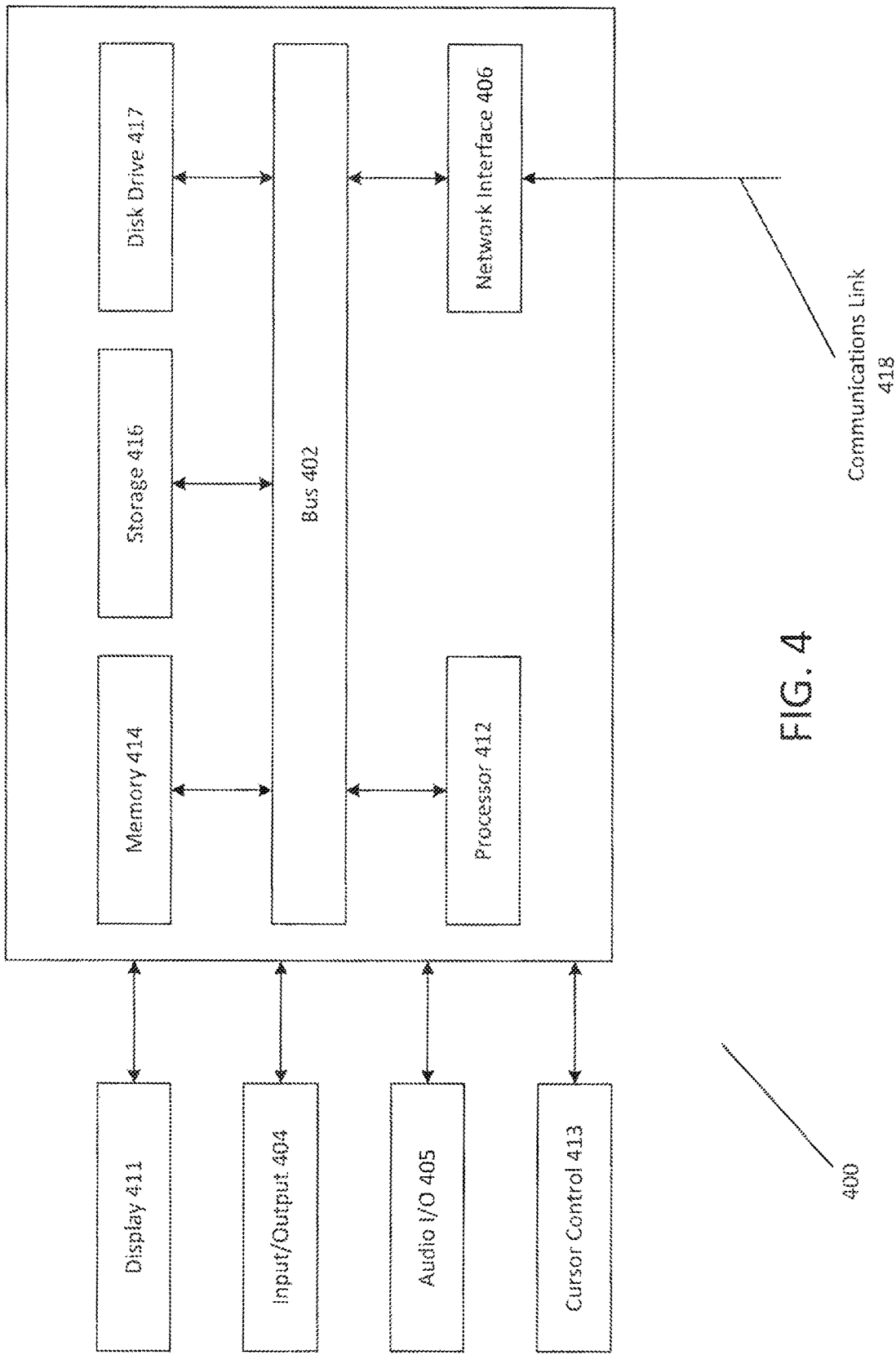
FIG. 4 is a block diagram of a computer system suitable for implementing one or more components in FIG. 1 according to one embodiment.

FIG. 4 is a block diagram of a computer system 400 suitable for implementing one or more embodiments of the present disclosure. In various implementations, the user device may comprise a personal computing device (e.g., smart phone, a computing tablet, a personal computer, laptop, PDA, Bluetooth device, key FOB, badge, etc.) capable of communicating with the network. The merchant and/or payment provider may utilize a network computing device (e.g., a network server) capable of communicating with the network. It should be appreciated that each of the devices utilized by the users may be implemented as computer system 400 in a manner as follows.

Computer system 400 includes a bus 402 or other communication mechanism for communicating information data, signals, and information between various components of computer system 400. Components include an input/output (I/O) component 404 that processes a user action, such as selecting keys from a keypad/keyboard, selecting one or more buttons or links, etc., and sends a corresponding signal to bus 402. I/O component 404 may also include an output component, such as a display 411 and a cursor control 413 (such as a keyboard, keypad, mouse, etc.). An optional audio input/output component 405 may also be included to allow a user to use voice for inputting information by converting audio signals. Audio I/O component 405 may allow the user to hear audio. A transceiver or network interface 406 transmits and receives signals between computer system 400 and other devices, such as another user device, a merchant device, or a payment provider server via network 160. In one embodiment, the transmission is wireless, although other transmission mediums and methods may also be suitable. A processor 412, which can be a microcontroller, digital signal processor (DSP), or other processing component, processes these various signals, such as for display on computer system 400 or transmission to other devices via a communication link 418. Processor 412 may also control transmission of information, such as cookies or IP addresses, to other devices.

Components of computer system 400 also include a system memory component 414 (e.g., RAM), a static storage component 416 (e.g., ROM), and/or a disk drive 417. Computer system 400 performs specific operations by processor 412 and other components by executing one or more sequences of instructions contained in system memory component 414. Logic may be encoded in a computer readable medium, which may refer to any medium that participates in providing instructions to processor 412 for execution. Such a medium may take many forms, including but not limited to, non-volatile media, volatile media, and transmission media. In various implementations, non-volatile media includes optical or magnetic disks, volatile media includes dynamic memory, such as system memory component 414, and transmission media includes coaxial cables, copper wire, and fiber optics, including wires that comprise bus 402. In one embodiment, the logic is encoded in non-transitory computer readable medium. In one example, transmission media may take the form of acoustic or light waves, such as those generated during radio wave, optical, and infrared data communications.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EEPROM, FLASH-EEPROM, any other memory chip or cartridge, or any other medium from which a computer is adapted to read.

In various embodiments of the present disclosure, execution of instruction sequences to practice the present disclosure may be performed by computer system 400. In various other embodiments of the present disclosure, a plurality of computer systems 400 coupled by communication link 418 to the network (e.g., such as a LAN, WLAN, PTSN, and/or various other wired or wireless networks, including telecommunications, mobile, and cellular phone networks) may perform instruction sequences to practice the present disclosure in coordination with one another.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software sub-components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A computer-implemented method for automatically controlling an audio output device communicatively coupled to an audio device, the method comprising:
   interactively receiving, while concurrently receiving a first ambient noise, a change in audio settings of the audio output device, wherein the audio settings include a volume setting of the audio output device;
   detecting a first sound based at least in part on the first ambient noise;
   automatically generating an audio preference for training the audio output device, wherein the audio preference includes the detected first sound and the received change in the audio settings;
   receiving, by the trained audio output device, a second ambient noise;
   detecting a second sound based at least in part on the received second ambient noise;
   determining, based at least in part on the first sound and the second sound, a score, wherein the score relates to a level of match between the first sound and the second sound; and
   updating, based at least in part on the determined score and the generated audio preference, the audio settings.

2. The computer-implemented method of claim 1, the method further comprising:
   training, using the detected second sound and the generated audio preference, the audio output device for recognizing the first sound based at least in part on the detected second sound.

3. The computer-implemented method of claim 1, the method further comprising:
   training the audio output device based at least in part on:
      the detected first sound, and
      the interactively received change in the audio settings.

4. The computer-implemented method of claim 1, wherein the first sound and the second sound are spoken commands.

5. The computer-implemented method of claim 1, wherein the first sound and the second sound relate to audio alerts.

6. The computer-implemented method of claim 1, wherein the first sound and the first ambient noise are distinct.

7. An audio output device, the audio output device comprising:
   at least one processor; and
   a memory coupled to the at least one processor and storing instructions that, when executed by the at least one processor, cause the audio output device to perform operations comprising:
      interactively receive, while concurrently receiving a first ambient noise, a change in audio settings of the audio output device, wherein the audio settings include a volume setting of the audio output device;
      detect a first sound based at least in part on the first ambient noise;
      automatically generate an audio preference for training the audio output device, wherein the audio preference includes the detected first sound and the received change in the audio settings;
      receive, by the trained audio output device, a second ambient noise;
      detect a second sound based at least in part on the received second ambient noise;
      determine, based at least in part on the first sound and the second sound, a score, wherein the score relates to a level of match between the first sound and the second sound; and
      update, based at least in part on the determined score and the generated audio preference, the audio settings.

8. The audio output device of claim 7, the operations further comprising:
   train, using the detected second sound and the generated audio preference, the audio output device for recognizing the first sound based at least in part on the detected second sound.

9. The audio output device of claim 7, the operations further comprising:
   train the audio output device based at least in part on:
      the detected first sound, and
      the interactively received change in the audio settings.

10. The audio output device of claim 7, wherein the first sound and the second sound are spoken commands.

11. The audio output device of claim 7, wherein the first sound and the second sound relate to audio alerts.

12. The audio output device of claim 7, wherein the first sound and the first ambient noise are distinct.

13. A system for automatically controlling an audio output device, the system comprising:
   at least one processor; and
   a memory coupled to the at least one processor and storing computer-executable instructions that, when executed by the at least one processor, cause the audio output device to perform operations comprising:
      interactively receive, while concurrently receiving a first ambient noise, a change in audio settings of the audio output device, wherein the audio settings include a volume setting of the audio output device;
      detect a first sound based at least in part on the first ambient noise;
      automatically generate an audio preference for training the audio output device, wherein the audio preference includes the detected first sound and the received change in the audio settings;
      receive, by the trained audio output device, a second ambient noise;
      detect a second sound based at least in part on the received second ambient noise;
      determine, based at least in part on the first sound and the second sound, a score, wherein the score relates to a level of match between the first sound and the second sound; and
      update, based at least in part on the determined score and the generated audio preference, the audio settings.

14. The system of claim 13, the computer-executable instructions when executed further causing the system to perform the operations comprising:
   train, using the detected second sound and the generated audio preference, the audio output device for recognizing the first sound based at least in part on the detected second sound.

15. The system of claim 13, the computer-executable instructions when executed further causing the system to perform the operations comprising:
   train the audio output device based at least in part on:
      the detected first sound, and
      the interactively received change in the audio settings.

16. The system of claim 13, wherein the first sound and the second sound are spoken commands.

17. The system of claim 13, wherein the first sound and the second sound relate to audio alerts.

18. The system of claim 13, wherein the first sound and the first ambient noise are distinct.

* * * * *